(12) United States Patent
Minotani et al.

(10) Patent No.: US 12,047,087 B2
(45) Date of Patent: Jul. 23, 2024

(54) AD CONVERTER

(71) Applicant: Nippon Telegraph and Telephone Corporation, Tokyo (JP)

(72) Inventors: Tadashi Minotani, Musashino (JP); Kenichi Matsunaga, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 168 days.

(21) Appl. No.: 17/771,268

(22) PCT Filed: Oct. 31, 2019

(86) PCT No.: PCT/JP2019/042755
§ 371 (c)(1),
(2) Date: Apr. 22, 2022

(87) PCT Pub. No.: WO2021/084678
PCT Pub. Date: May 6, 2021

(65) Prior Publication Data
US 2022/0416799 A1 Dec. 29, 2022

(51) Int. Cl.
*H03M 1/12* (2006.01)
*H03M 1/08* (2006.01)
(Continued)

(52) U.S. Cl.
CPC ............... *H03M 1/08* (2013.01); *H03M 1/34* (2013.01); *H03M 1/38* (2013.01); *H03M 1/46* (2013.01)

(58) Field of Classification Search
CPC ............ H03M 1/08; H03M 1/34; H03M 1/38; H03M 1/46
See application file for complete search history.

(56) References Cited

U.S. PATENT DOCUMENTS

| 4,395,732 A | 7/1983 | Upton | |
|---|---|---|---|
| 2013/0265180 A1* | 10/2013 | Matsumoto | H03M 1/38 341/110 |

FOREIGN PATENT DOCUMENTS

| DE | 38 25 884 A1 | 2/1990 |
|---|---|---|
| JP | S58-31618 A | 2/1983 |
| JP | 2016-213531 A | 12/2016 |

OTHER PUBLICATIONS

MEMEs Support Page, *Overview and Mechanism of A / D Conversion*, MEMEs Support Page-Play with MEMEs!, Sep. 10, 2018 (reading day), http://memes.sakura.ne.jp/memes/?page_id=1120, pp. 1-6.

* cited by examiner

*Primary Examiner* — Joseph J Lauture
(74) *Attorney, Agent, or Firm* — Workman Nydegger

(57) ABSTRACT

An AD converter includes: an accumulation conversion unit that performs a comparison of magnitudes of an input voltage V2 and an accumulated voltage V1 obtained by accumulating a unit voltage and outputs a comparison signal representing a result of the comparison; an accumulation comparison determination unit that repeatedly compares an accumulated voltage V1, obtained by repeating the comparison until the comparison signal changes and corresponding to an accumulated voltage V1 at which the comparison signal changes, and the input voltage V2 a predetermined number of times to determine an equivalent-state accumulation number in which a state probability that the comparison signal changes is equal to a threshold; and a control unit that determines conversion data of the input voltage using the equivalent-state accumulation number.

4 Claims, 5 Drawing Sheets

(51) Int. Cl.
*H03M 1/34* (2006.01)
*H03M 1/38* (2006.01)
*H03M 1/46* (2006.01)

(a) V1 INPUT OF COMPARATOR (b) V2 INPUT OF COMPARATOR (c) EXEMPLARY TIME WAVEFORM OF OUTPUT OF COMPARATOR

AD CONVERTER

TECHNICAL FIELD

The present invention relates to an AD converter in which the influence of fluctuations in voltages inputted to a comparator is suppressed.

BACKGROUND ART

As is well known, an AD converter consists of a DA converter unit that outputs a known voltage, a sample hold section that holds a voltage value of an analog input, and a comparator. The output value of the DA converter unit is sequentially changed, and a digital value, obtained when the minimum output value of the DA converter unit is set at which the output of the comparator changes from a low output voltage to a high output voltage, is used as a converted value of the AD converter (Non-Patent Literature 1).

The output value of the DA converter unit inputted to the comparator and the voltage value of the analog input held in the sample hold section fluctuate due to noises of circuits constituting the units. Consequently, a pulse shape having irregular width and period may be outputted to the comparator.

CITATION LIST

Non-Patent Literature

Non-Patent Literature 1: Outline and Mechanism of A/D Convert, Support Page for MEMEs (searched on 16 May 2019), Internet (URL: http://memes.sakura.ne.jp/memes/?page_id=1120)

SUMMARY OF THE INVENTION

Technical Problem

Even when an average of input voltages from one unit is lower than an average of inputs from the other unit in the comparator, the output of the comparator may be the high output voltage due to the influence of fluctuations. Therefore, there is a problem in that the minimum output value of the DA converter unit, at which the output of the comparator changes from the low output voltage to the high output voltage, may be erroneously determined, which may lead to a larger conversion error.

The present invention has been made considering the above problem, and an object of the present invention is to provide an AD converter that suppresses the influence of fluctuations in the internal voltages to reduce conversion errors.

Means for Solving the Problem

An AD converter according to an aspect of the present invention essentially includes: an accumulation conversion unit that performs a comparison of magnitudes of an input voltage and an accumulated voltage obtained by accumulating a unit voltage and outputs a comparison signal representing a result of the comparison; an accumulation comparison determination unit that repeatedly compares an accumulated voltage, obtained by repeating the comparison until the comparison signal changes and corresponding to an accumulated voltage at which the comparison signal changes, and the input voltage a predetermined number of times to determine an equivalent-state accumulation number in which a state probability that the comparison signal changes is equal to a threshold; and a control unit that determines conversion data of the input voltage using the equivalent-state accumulation number.

Effects of the Invention

According to the present invention, it is possible to provide an AD converter that suppresses the influence of fluctuations in the internal voltages to reduce conversion errors.

BRIEF DESCRIPTION OF DRAWINGS

FIG. 4 is a view schematically showing fluctuations in input voltages of the comparator shown in FIG. 1, in which FIG. 4(a) shows V1, FIG. 4(b) shows V2, and FIG. 4(c) shows outputs of the comparator.

DESCRIPTION OF EMBODIMENTS

Figure 1:
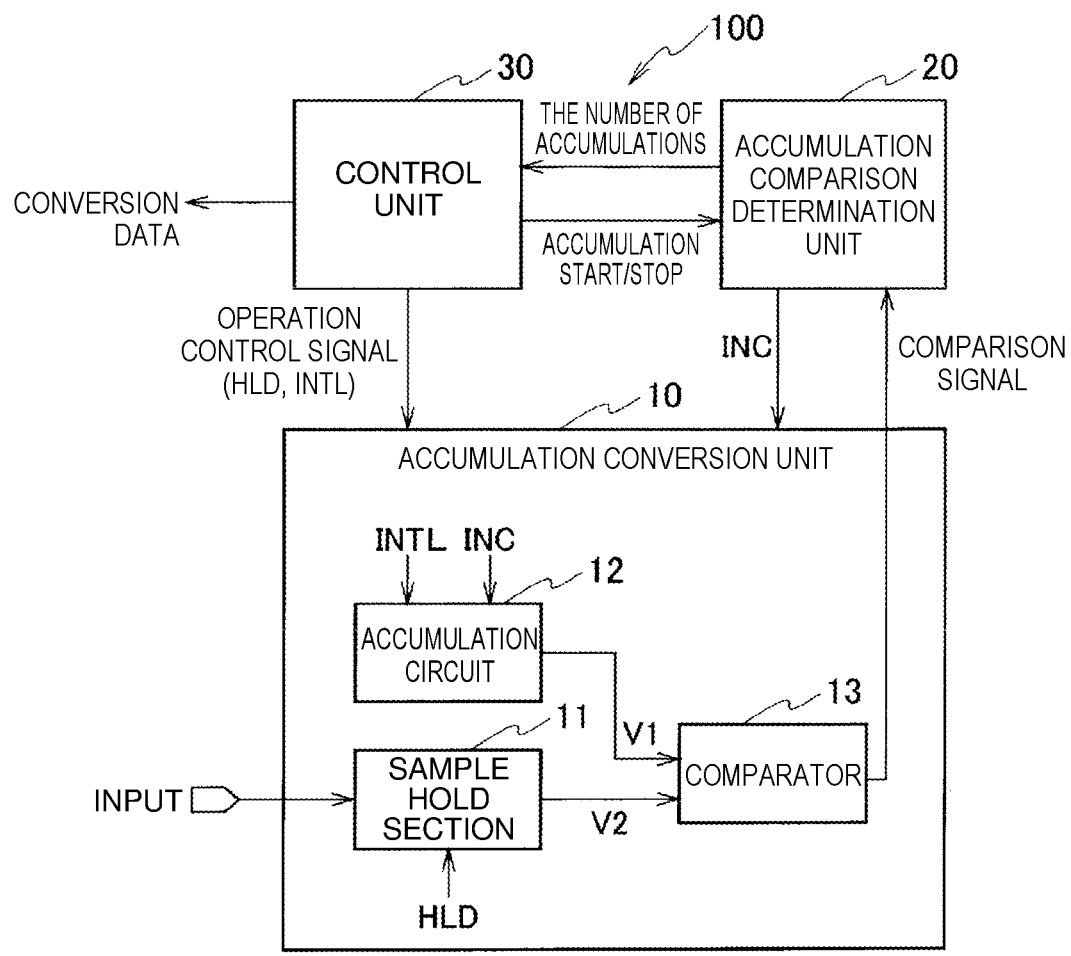
FIG. 1 is a functional block diagram showing an exemplary configuration of an AD converter according to an embodiment of the present invention.

Hereinafter, an embodiment of the present invention will be described with reference to the drawings. The same reference characters are given to the same components throughout the drawings, and the description thereof is not repeated.

FIG. 1 shows a functional block diagram showing an exemplary configuration of an AD converter according to an embodiment of the present invention. An AD converter 100 shown in FIG. 1 includes an accumulation conversion unit 10, an accumulation comparison determination unit 20, and a control unit 30. The accumulation conversion unit 10 includes a sample hold section 11, an accumulation circuit 12, and a comparator 13.

The AD converter 100 compares an accumulated voltage V1, which is an output voltage of the accumulation circuit 12 performing DA-conversion in accordance with the number of accumulations corresponding to the number of times that a predetermined unit voltage is accumulated, and an input voltage V2 in the comparator 13, and thereby deriving a converted value from the minimum number of accumulations that an output of the comparator 13 changes. For this process, the AD converter 100 includes the accumulation conversion unit 10, the accumulation comparison determination unit 20, and the control unit 30. The accumulation conversion unit 10 increases the accumulated voltage V1 and outputs a comparison signal representing a result of the comparison of magnitudes of the input voltage V2 and the accumulated voltage V1. The accumulation comparison determination unit 20 controls the accumulation circuit 12 through a normal accumulation step in which at least accumulation and comparison signal monitoring are repeated and a determination accumulation step in which a ratio of a low output voltage or a high output voltage in the comparison signals is observed after each accumulation. The control unit 30 controls the initialization, start, and stop of the accumulation conversion unit 10 and the accumulation comparison determination unit 20.

As described above, the AD converter 100 includes the accumulation conversion unit 10, the accumulation comparison determination unit 20, and the control unit 30, and these components operate as follows. The accumulation conversion unit 10 performs a comparison of magnitudes of the input voltage V2 and the accumulated voltage V1 obtained by accumulating a unit voltage and outputs a comparison signal representing a result of the comparison. The accumulation comparison determination unit 20 repeatedly compares an accumulated voltage V1, obtained by repeating the comparison until the comparison signal changes and corresponding to an accumulated voltage V1 at which the comparison signal changes, and the input voltage V2 a predetermined number of times to determine an equivalent-state accumulation number in which a state probability that the comparison signal changes is equal to a threshold. The control unit 30 determines conversion data of the input voltage V2 using the equivalent-state accumulation number.

An operation of the AD converter 100 will be described in detail.

The comparator 13 outputs a low output voltage when V1>V2, and outputs a high output voltage when V1<V2.

When the AD converter 100 starts to operate, the accumulation circuit 12 is first initialized according to an INTL signal, and the sample hold section 11 holds an input voltage Vin according to an HLD signal.

Figure 2:
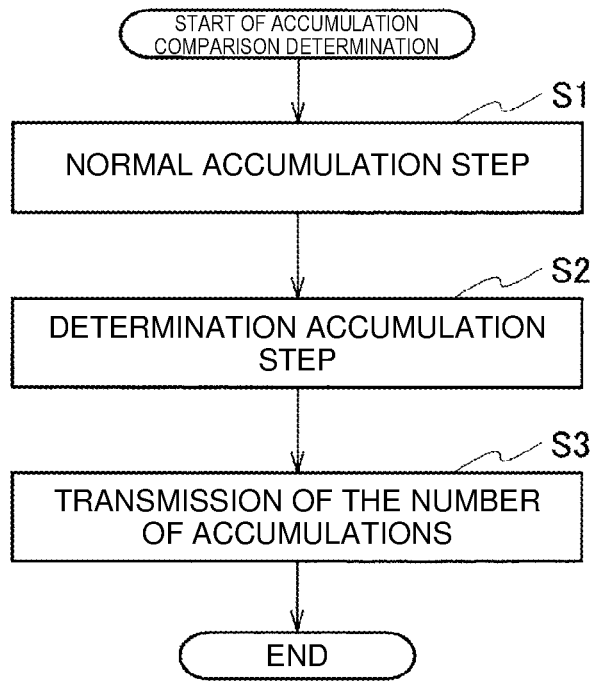
FIG. 2 is a flowchart showing a procedure of the accumulation comparison determination unit shown in FIG. 1.
Figure 3:
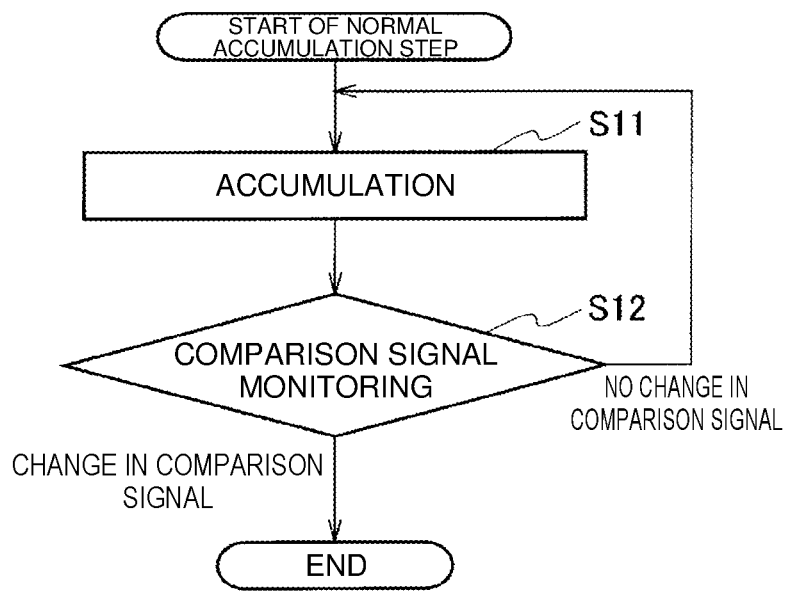
FIG. 3 is a flowchart showing a procedure of the normal accumulation step shown in FIG. 2.

Next, an accumulation start signal is outputted from the control unit 30 to the accumulation comparison determination unit to start the accumulation by the accumulation comparison determination unit 20. FIG. 2 shows a processing flow of the accumulation comparison determination unit. When the accumulation start signal is inputted, a normal accumulation step S1 is first started. FIG. 3 shows a processing flow of the normal accumulation step. In the normal accumulation step, after a predetermined unit voltage is accumulated once according to an INC signal in the accumulation circuit 12, a comparison signal is monitored. When there is no change in the comparison signal, the accumulation is performed again (step S12). When the accumulated voltage V1, which is the output of the accumulation circuit 12, approaches the neighborhood of $V_{in}$, fluctuations caused by circuits constituting the accumulation circuit 12 and the sample hold section 11 may momentarily lead to V1<V2, and thereby the comparison signal may be the high output voltage.

Figure 4:
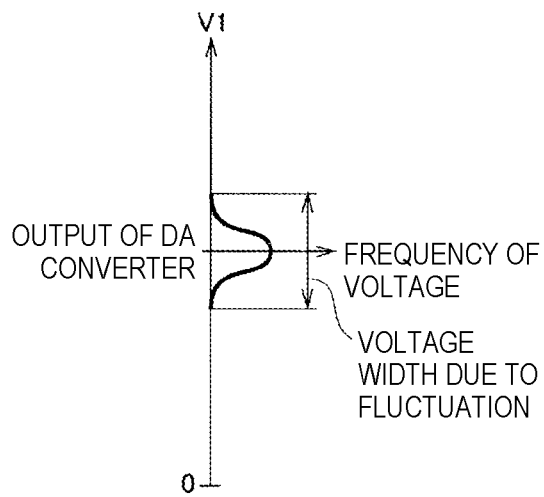
Figure 4:
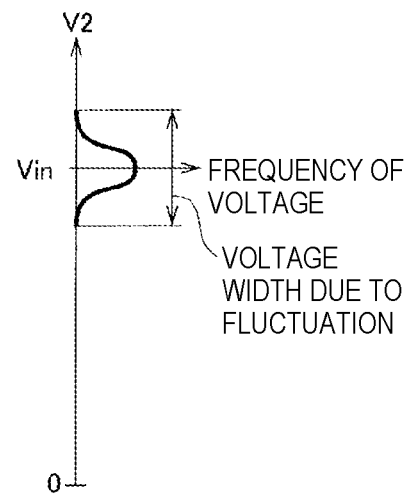
Figure 4:
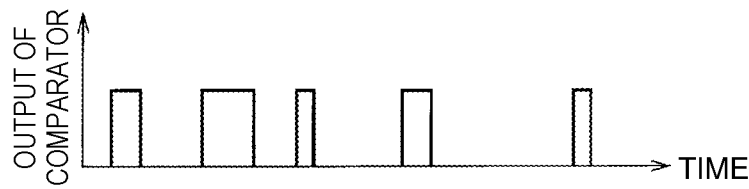

FIG. 4 schematically shows fluctuations in input voltages in the comparator 13. FIG. 4(a) shows an accumulated voltage V1, and FIG. 4(b) shows an input voltage V2. FIG. 4(c) shows a state in which the output of the comparator 13 alternates the low output voltage and the high output voltage.

As shown in FIG. 4, since the average of the input voltage V1 is smaller than the average of the accumulated voltage V2, the output of the comparator 13 should be the high output voltage. However, there exist sections where the output of the comparator 13 is the low voltage due to the fluctuations in V1 and V2.

When there is a change in the comparison signal in comparison signal monitoring, the procedure proceeds to the determination accumulation step S2.

Figure 5:
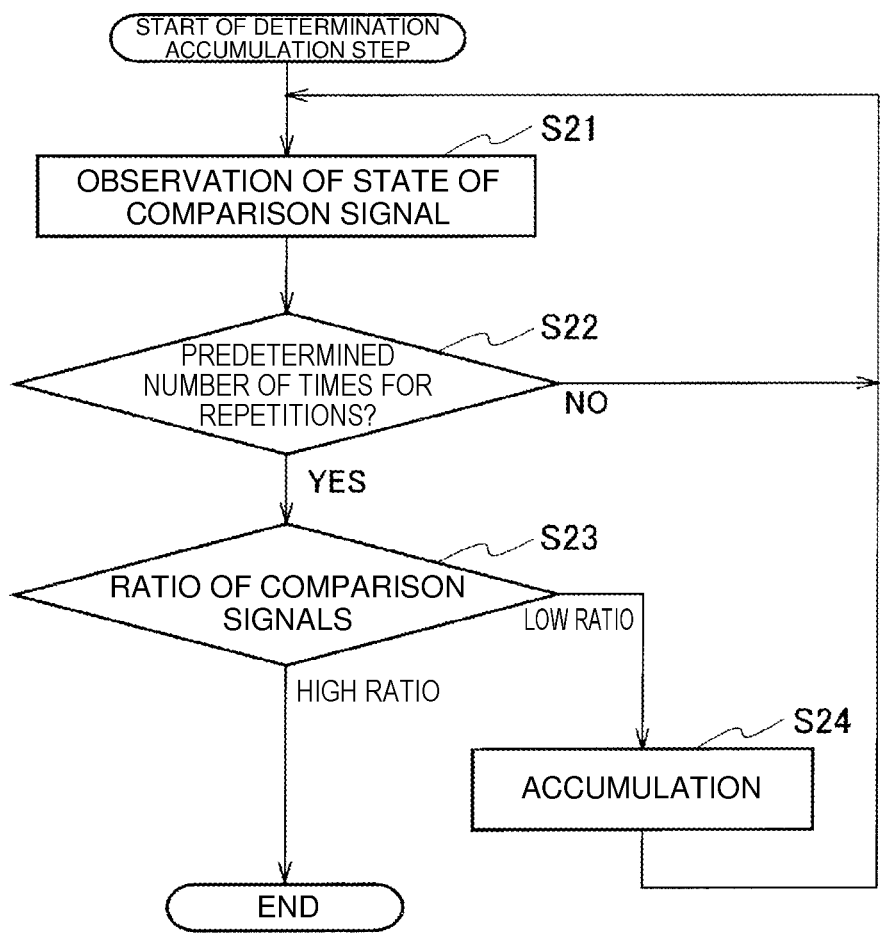
FIG. 5 is a flowchart showing a procedure of the determination accumulation step shown in FIG. 2.
Figure 6:
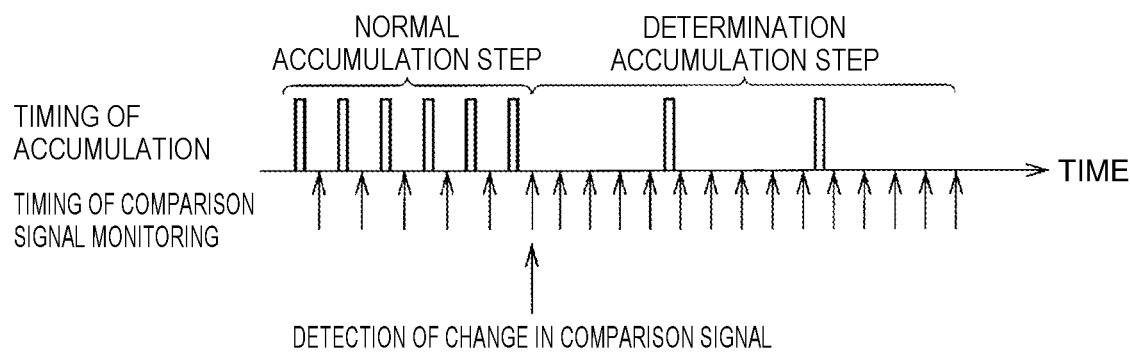
FIG. 6 is a view schematically showing the operation timing in the normal accumulation step and the determination accumulation step shown in FIG. 2.

FIG. 5 shows a processing flow of the determination accumulation step S2. After the proceeding to the determination accumulation step S2, the voltage state of the comparison signal is observed for a predetermined number and in a predetermined interval of the comparison signal monitoring (NO loop of S22, including step S21), and the number of monitoring that the high output voltage is observed is stored. When a ratio obtained by dividing the number of monitoring that the high output voltage is observed by the predetermined number of comparison signal monitoring is lower than a preset ratio (preferably 0.5) ("LOW RATIO" in step S23), the accumulation (step S24) is performed, and the voltage state of the comparison signal is then observed again. When a ratio obtained by dividing the number of monitoring that the high output voltage is observed by the predetermined number of comparison signal monitoring is higher than the preset ratio ("HIGH RATIO" in step S23), the determination accumulation step is terminated, and the number of accumulations is then transmitted. FIG. 6 shows an example of the timing of the accumulation and the comparison signal monitoring. While the comparison signal monitoring is performed once for each accumulation in the normal accumulation step S1, the comparison signal monitoring is performed multiple times for each accumulation in the determination accumulation step S2. When the comparison signal monitoring is performed multiple times, the comparison signal monitoring is repeated a predetermined number of times Nm, and a probability PL is then determined by dividing the number of times that the comparison signal is the low output voltage by the predetermined number of times Nm. Since representing the probability of the state of the comparison signal, the probability PL may be referred to as the state probability.

A method of calculating the probability that the output of the comparator 13 is the low output voltage in the presence of fluctuations and deriving the number of accumulations that V1=V2 is valid (hereinafter, described as the equivalent-state accumulation number) will be described below.

When the standard deviation of fluctuations caused by the accumulation circuit 12 is represented as σi and the accumulated voltage is represented as Vo, the probability distribution Pv1(v) of V1 is represented by the following expression.

Math. 1

$$Pv1(v) = \frac{1}{\sqrt{2\pi}\,\sigma i} \exp\left[-\frac{(v - Vo)^2}{2\sigma i^2}\right] \quad (1)$$

When the standard deviation of fluctuations caused by a circuit constituting the sample hold section 11 is represented as σs and the input voltage is represented as Vi, the probability distribution Pv2(v) of V2 is represented by the following expression.

Math. 2

$$Pv2(v) = \frac{1}{\sqrt{2\pi}\,\sigma s} \exp\left[-\frac{(v - Vi)^2}{2\sigma s^2}\right] \quad (2)$$

The probability P1x(Vx) that V1<Vx is valid when V2 is Vx is represented by the following expression.

Math. 3

$$P1x(Vx) = \int_{-\infty}^{Vx} Pv1(v)dv = \frac{1}{2}\left\{1 + \left(\frac{Vx - Vo}{\sqrt{2}\sigma i}\right)\right\} \quad (3)$$

In Expression (3), "erf( )" represents an error function. The probability distribution that the output of the comparator 13 is the low output voltage is the product of the probability distribution of V2 and Expression (3), and thus the probability PL that the output of the comparator 13 is the low output voltage is represented by the following expression, which means the integral of V2 with respect to the entire region.

Math. 4

$$PL = \int_{-\infty}^{\infty} Pv2(Vx)P1x(Vx)dVx = \quad (4)$$
$$\frac{1}{2}\int_{-\infty}^{\infty} \frac{1}{\sqrt{2\pi}\sigma s}\exp\left[-\frac{(Vx-Vi)^2}{2\sigma s^2}\right]\left\{1 + \mathrm{erf}\left(\frac{Vx-Vo}{\sqrt{2}\sigma i}\right)\right\}dVx$$

Figure 7:
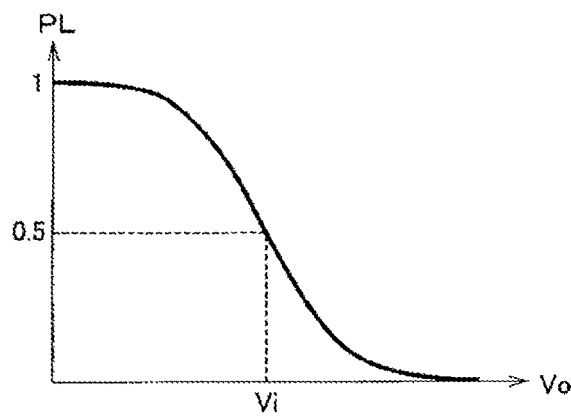
FIG. 7 is an exemplary result of a numerical calculation of a probability that an output of the comparator shown in FIG. 1 is the low output voltage.

FIG. 7 shows an example of a numerical calculation with Expression (4). When Vo=Vi, that is, V1=V2 is valid, the probability PL that the output of the comparator 13 is the low output voltage is 0.5. Therefore, the number of accumulations that PL is 0.5 corresponds to the equivalent-state accumulation number.

Since the number of accumulations is an integer and thus increases discretely, PL seldom becomes exactly 0.5. Therefore, linear interpolation is performed using the number of accumulations that the PL is 0.5 or less and the probability PL1 of the low output voltage at that time as well as the number of accumulations obtained by subtracting 1 from the above number of accumulations and the probability PL0 of the low output voltage at that time, and thereby the equivalent-state accumulation number, which is the number of accumulations that the probability PL is 0.5, is derived.

In FIG. 7, PL=0 represents a probability of occurrence that the output of the comparator 13 is the high output voltage. FIG. 7 indicates that the output of the comparator 13 may be the high output voltage when Vo is lower than Vi, and the output of the comparator 13 may be the high output voltage after Vo becomes higher than Vi. Therefore, when the point at which the output of the comparator 13 changes is determined as the number of accumulations, an error of one or more accumulations may occur.

In the present embodiment, after a change in the output of the comparator 13 is detected, the output of the comparator is monitored multiple times and the equivalent-state accumulation number that PL=0.5 is valid, which corresponds to Vo=Vi, is then determined from the ratio related to the output state of the comparator 13. Accordingly, the number of accumulations closer to that corresponding to Vo=Vi is obtained compared with the case where only the change in the output of the comparator 13 is monitored. Therefore, according to the present embodiment, it is possible to suppress the influence of fluctuations in the internal voltages to reduce conversion errors.

Although the probability PL is calculated using the number of times that the comparison signal is the low voltage output in the above description, the probability PL may be determined using the number of times that the comparison signal is the high output voltage.

REFERENCE SIGNS LIST

10 Accumulation conversion unit
11 Sample hold section
12 Accumulation circuit
13 Comparator
20 Accumulation comparison determination unit
30 Control unit
100 AD converter

The invention claimed is:

1. An AD converter comprising:
an accumulation conversion unit that performs a comparison of magnitudes of an input voltage signal that is input into the accumulation conversion unit and an accumulated voltage signal that is obtained by accumulating a unit voltage that is received from an accumulation comparison determination unit in an accumulation circuit of the accumulation conversion unit, the accumulation conversion unit outputting a comparison signal representing a result of the comparison of the input voltage signal and the accumulated voltage signal, wherein the comparison of the input voltage signal accumulated voltage signal is repeated to until the comparison signal changes to determine an accumulated voltage signal which the comparison signal changes;
the accumulation comparison determination unit that repeatedly compares the accumulated voltage signal and the input voltage signal a predetermined number of times to determine an equivalent-state accumulation number in which a state probability that the comparison signal changes is equal to a threshold; and
a control unit that determines conversion data of the input voltage using the equivalent-state accumulation number.

2. The AD converter according to claim 1, wherein the equivalent-state accumulation number is a value that is determined by performing linear interpolation on a number of accumulations that the state probability is equal to or less than the threshold and a state probability that an output of a comparator is a low output voltage as well as a number of accumulations obtained by subtracting 1 from the number of accumulations and a state probability that an output of the comparator is the low output voltage.

3. The AD converter according to claim 2, wherein the threshold is 0.5.

4. The AD converter according to claim 1, wherein the threshold is 0.5.

* * * * *